United States Patent [19]
Nishimori et al.

[11] Patent Number: 5,988,430
[45] Date of Patent: Nov. 23, 1999

[54] PART SUPPLY APPARATUS

[75] Inventors: Yuzo Nishimori; Makito Seno, both of Nakakoma-gun; Masato Tanino; Sugio Morito, both of Kofu, all of Japan

[73] Assignee: Matsushita Electric Industrial Co., Ltd., Osaka, Japan

[21] Appl. No.: 09/000,051

[22] PCT Filed: May 20, 1997

[86] PCT No.: PCT/JP97/01693

§ 371 Date: Jan. 21, 1998

§ 102(e) Date: Jan. 21, 1998

[87] PCT Pub. No.: WO97/44157

PCT Pub. Date: Nov. 27, 1997

[30] Foreign Application Priority Data

May 22, 1996 [JP] Japan ................................. 8-126665

[51] Int. Cl.⁶ ................................................. B65G 59/00
[52] U.S. Cl. ............................................ 221/92; 221/258
[58] Field of Search .............................. 221/92, 94, 103, 221/106, 129, 208, 277, 258, 289

[56] References Cited

U.S. PATENT DOCUMENTS 3,051,286  8/1962  Stange et al. .......................... 221/258
5,154,316  10/1992  Holcomb et al. ....................... 221/258

FOREIGN PATENT DOCUMENTS 391 707    10/1990  European Pat. Off. .
61-121397   6/1986  Japan .
62-199322   9/1987  Japan .
3-72698     3/1991  Japan .
3-131431    6/1991  Japan .

Primary Examiner—Kenneth W. Noland
Attorney, Agent, or Firm—Wenderoth, Lind & Ponack, L.L.P.

[57] ABSTRACT

Provided is a plurality of component supply units (A, B, C) having a component supply table (11) mounted with a plurality of component supply cassettes (1), a rail (12) which reciprocatingly movably guides and supports the component supply table, a base (22) which fixes the rail, a driving member (14) which moves in a direction in which a component determining table moves while being able to be positioned in the base, and a coupling member (13f, 13c, 13r, 16) which can releasably couple the component determining table with the driving member.

14 Claims, 4 Drawing Sheets

PART SUPPLY APPARATUS

TECHNICAL FIELD

The present invention relates to a component supply apparatus for supplying components to a working machine such as an electronic component mounting apparatus.

BACKGROUND ART

In recent years, the component supply apparatus for supplying electronic components to an electronic component mounting apparatus which mounts the electronic components onto a printed board has had the practices of diversification in the amount of mounted component supply cassettes and division of its supply table in order to cope with the requirements for multi-sort small-quantity production and an increase in the operating rate.

Conventionally, this kind of component supply apparatus has generally had a construction as disclosed in Examined Japanese Patent Publication No. 3-221326. The construction will be described below with reference to FIG. 5 and FIG. 6.

As shown in FIGS. 5 and 6, a first supply table 2 and a second supply table 3 which are able to set a plurality of component supply cassettes 1 are reciprocatingly movably guided by a rail 4. Below these supply tables 2 and 3 is provided a threaded shaft 5 fixed parallel to the rail 4. On the lower surface side of the supply tables 2 and 3 are provided a nut section 6 meshed with the threaded shaft 5 and a hollow motor 7 which rotationally drives the nut section 6 around the threaded shaft 5. The reference numeral 8 denotes a mounting head which attracts by suction a component at the component supply cassette 1 and transfers and mounts it onto a board 10 positioned by an X-Y table 9.

When a pair of component supply cassettes 1 of identical electronic components are set at the supply tables 2 and 3 in the aforementioned construction and when a depletion of components occurs in one supply table, the table is switched to the other supply table for alternative use, thereby allowing the component supply cassette 1 in which the depletion of components occurs to be supplied with components in the meantime.

When there are many sorts of the components to be used, it can be performed to set component supply cassettes 1 of electronic components of different sorts at the supply tables 2 and 3 and supply the components to the mounting head 8 through successive switching between the supply tables 2 and 3.

However, since the constituent elements of the rail 4, threaded shaft 5 and so on are arranged on one base in the aforementioned prior art, various kinds of component supply apparatuses are required to be prepared depending on the amount, installation space condition and so on of necessary component supply cassettes 1. Furthermore, it is difficult to flexibly change the number of component supply cassettes and the number of supply tables depending on a change in the production state and the like.

The present invention has an object to provide a component supply apparatus capable of freely using a plurality of component supply units by connecting them.

DISCLOSURE OF INVENTION

In order to achieve the aforementioned object, the present invention is constructed as follows.

According to a first aspect of the present invention, there is provided a component supply apparatus comprising: a plurality of component supply units, the component supply units each comprising:

a component supply table mounted with a plurality of component supply cassettes having a plurality of components;

a driving member which moves in a direction in which the component supply table moves while being able to be positioned in the base; and a coupling member which can releasably couple the component supply table with the driving member, whereby the component supply cassette of the component supply table is able to be positioned in an arbitrary position on the base by driving the driving member based on coupling between the driving member and the coupling member, wherein the component supply table of the component supply unit can be moved and positioned in another component supply unit by its driving member by being coupled with the driving member of another component supply unit in a state in which the component supply units are connected together in a direction in which the component supply table moves.

According to a second aspect of the present invention, there is provided a component supply apparatus comprising first and second component supply units, the first component supply unit comprising:

a first component supply table mounted with a plurality of first component supply cassettes having a plurality of components to be supplied to a component supply position;

a first driving member which moves in a direction in which the first component supply table moves while being able to be positioned in a first base; and a first coupling member which can releasably couple the first component supply table with the first driving member, whereby the first component supply cassette of the first component supply table is positioned in the component supply position by driving the first driving member based on coupling between the first driving member and the first coupling member, thereby supplying the component from the first component supply cassette into the component determining position, the second component supply unit comprising:

a second component supply table mounted with a plurality of second component supply cassettes having a plurality of components to be supplied to the component supply position of the first component supply unit;

a second driving member which moves in a direction in which the second component supply table moves while being able to be positioned in a second base; and a second coupling member which can releasably couple the second component supply table with the second driving member, whereby the second component supply cassette of the second component supply table is moved from the second component supply unit to the first component supply unit by driving the second driving member based on coupling between the second driving member and the second coupling member and thereafter positioned in the component supply position of the first component supply unit by the first driving member, thereby supplying the component from the second component supply cassette into the component determining position, the first and second driving members being able to be independently coupled with or decoupled from the first and second component supply tables, wherein when the first and second component supply units are connected with each other in the direction in which the component supply table moves, the first component supply table enters the second component supply unit in a state in which the first component supply table of the first component supply unit is coupled with the first driving member by the first coupling member, thereafter the coupling between the first driving member of the first component supply unit and the first coupling member is released, and the first coupling member of the first component supply unit is coupled with the second driving member of the second component supply unit, thereby moving the first component supply table of the first component supply unit into the second component supply unit by the second driving member.

According to a third aspect of the present invention, there is provided a component supply apparatus as set forth in the first or second aspect, wherein the coupling member has a plurality of engagement portions provided in positions in different directions of movement of the component supply table and a releasable retainer portion which is provided at each of the driving members and is releasably engaged with each of the engagement portions.

According to a fourth aspect of the present invention, there is provided a component supply apparatus as set forth in any one of the first through third aspects, wherein a rail which is fixed to the base of each component supply unit and reciprocatingly movably guides and supports the component supply table is further provided, and when the component supply units are connected with each other, the rails are connected with each other so that the component supply table is moved and guided along the rails.

According to a fifth aspect of the present invention, there is provided a component supply apparatus as set forth in any one of the first through fourth aspects, wherein each driving member has a threaded shaft fixed to the base in the direction in which the component supply table moves, a nut section meshed with the threaded shaft and a hollow motor which rotationally drives the nut section around the threaded shaft to reciprocatingly move it along the threaded shaft and is able to be coupled with or decoupled from the coupling member.

According to a sixth aspect of the present invention, there is provided a component supply apparatus as set forth in any one of the second through fourth aspects, further comprising:

a third component supply table mounted with a plurality of third component supply cassettes;

a third driving member which moves in a direction in which the third component supply table moves while being able to be positioned in a third base;

a third coupling member which can releasably couple the third component supply table with the third driving member; and a third component supply unit which moves the third component supply cassette of the third component supply table from the third component supply unit to the first component supply unit by driving the third driving member based on coupling between the third driving member and the third coupling member and thereafter positions it in the component supply position of the first component supply unit by the first driving member, thereby supplying a component from the third component supply cassette into the component determining position, the third driving member being able to be independently coupled with or decoupled from the first and second coupling members of the first and second component supply tables, the second component supply unit, the first component supply unit and the third component supply unit being connected together in this order in the direction in which the component supply table moves, thereby using the second and third component supply units as a standby region, whereby when replenishing the first component supply table with components by moving the first component supply table of the first component supply unit coupled with the first driving member by the first coupling member to one component supply unit side of the second and third component supply units by the first driving member and moving the first component supply table of the first component supply unit to the one component supply unit by its driving member coupled with the driving member of the one component supply unit by the first coupling member, the component supply table of the other component supply unit is moved from the other component supply unit out of the second and third component supply units to the first component supply unit, thereby supplying the component of the component supply unit to the component supply position.

With the above arrangement, by properly combining the component supply units for each electronic component mounting apparatus having variations in the number of mounted component supply cassettes, the number of necessary component supply tables and so on, a component supply apparatus appropriate for each electronic component mounting apparatus can be provided. The component supply units can be common, and this is advantageous in terms of production and cost.

Furthermore, in the component supply apparatus of each aspect of the present invention, by providing the coupling member with a plurality of engagement portions provided in positions in different directions of movement at the component supply table and a releasable retainer portion which is provided at the driving member and is releasably engaged with the engagement portion, the component supply apparatus of the present invention can be achieved with a simple construction.

BRIEF DESCRIPTION OF THE DRAWINGS

The above and other objects and features of the present invention will become apparent from the following description in connection with the preferred embodiments thereof by way of the illustrations provided in the accompanying drawings, wherein.

BEST MODE FOR CARRYING OUT THE INVENTION

Figure 1:
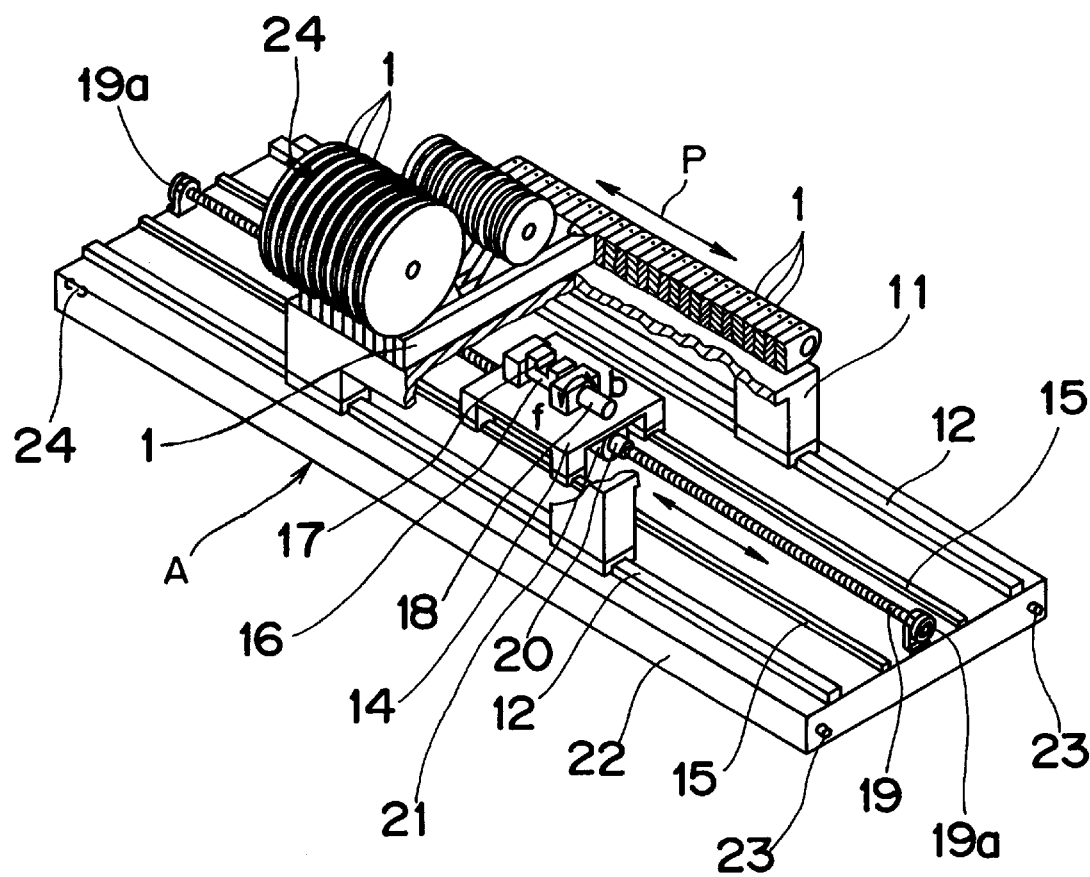
FIG. 1 is a perspective view showing a component supply unit of a component supply apparatus according to an embodiment of the present invention.

Before continuing the description of the present invention, note that the same components are denoted by the same reference numerals in the accompanying drawings.

A component supply apparatus according to an embodiment of the present invention will be described below with reference to FIG. 1, FIG. 2, FIG. 3 and FIG. 4.

Figure 2:
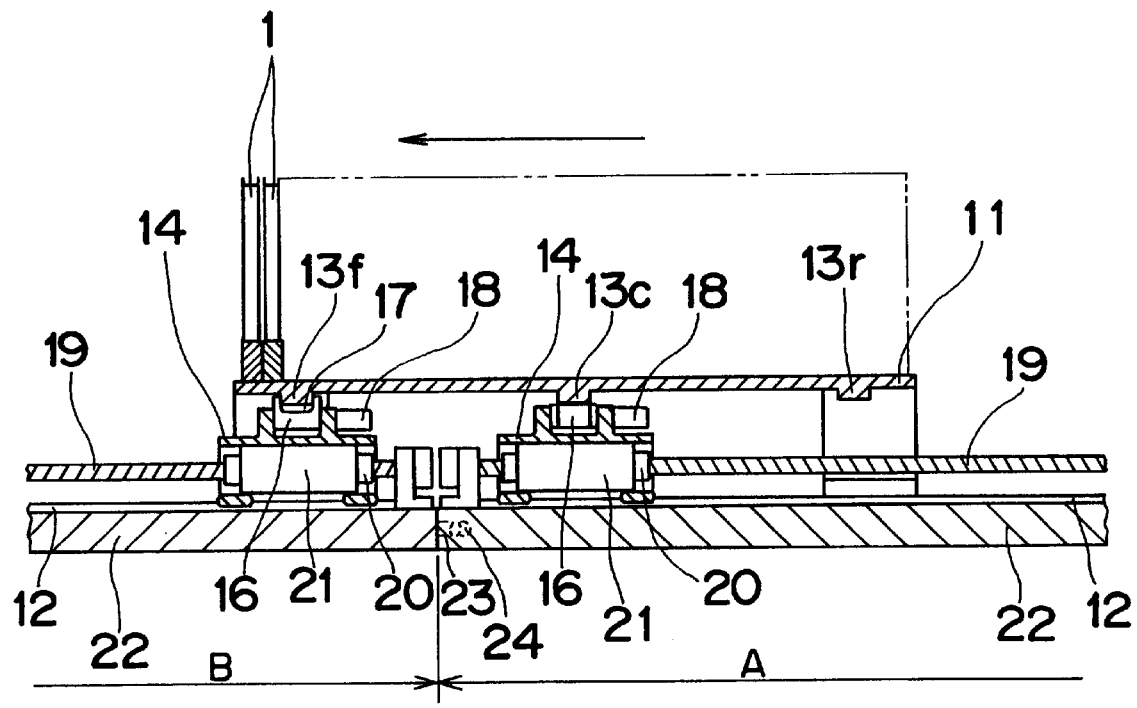
FIG. 2 is a sectional view showing the operation of a component supply table when the component supply units are connected together.
Figure 3:
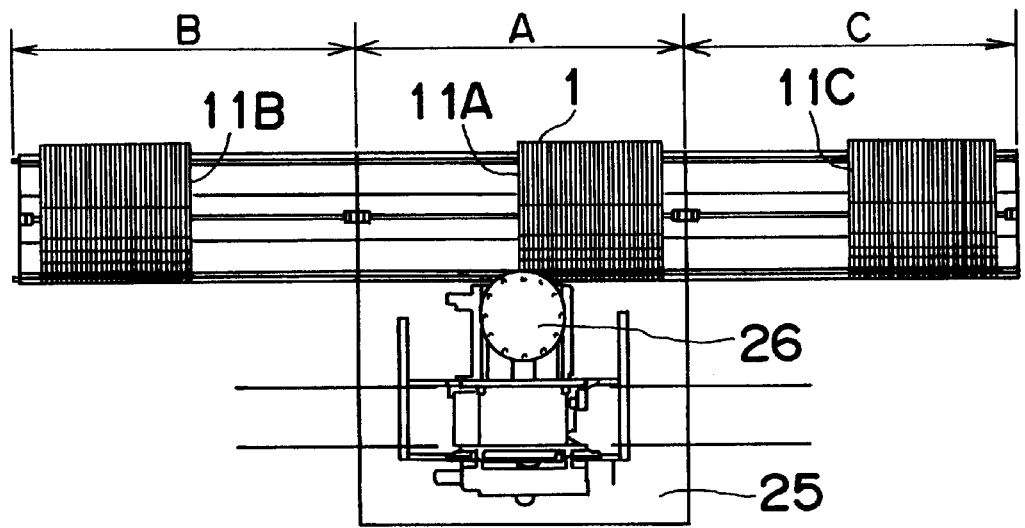
FIG. 3 is a plan view of three of the above component supply units connected together.

As shown in FIG. 3, the component supply apparatus of the present embodiment is used for supplying a component to an electronic component mounting apparatus 25 and is constructed by connecting three component supply units A, B and C. The component supply units A, B and C have an identical construction, and one of them, or the component supply unit A is taken as an example to be described with reference to FIG. 1 and FIG. 2.

In FIG. 1 and FIG. 2, reference numeral 11 denotes a component supply table, in which a plurality of component supply cassettes 1 storing therein a number of components to be supplied to a component supply position of the component mounting apparatus 25 can be set, and electronic components can be fed one by one from each cassette 1 to be subjected to use. The component supply table 11 has its both leg portions guided and supported by a pair of parallel rails 12 and 12 and is able to reciprocate in a direction P in which the cassettes 1 are arranged parallel to one another. The rails 12 and 12 are fixed to both side portions of a base 22.

Below the component supply table 11 is provided projecting portions (an example of the engagement portion) 13f, 13r and 13c (generically denoted by 13) in a plurality of, for example, three portions at specified intervals in a direction in which it moves. These are positioned near one end, near the other end and a center portion of the table 11 in its moving direction. Each projecting portion 13 extends vertically downward from the lower surface of the table plate of the table 11 and is constructed in, for example, a rectangular parallelopiped block shape, however, it is not always limited to this shape.

Reference numeral 14 denotes a conveyance table (an example of the driving member) for driving the component supply table 11, and it is provided below the component supply table 11 while being guided and supported by a pair of guide rods 15 and 15 which are fixed to the base 22 parallel to and between the pair of rails 12 and 12 for guiding and supporting the table 11. The conveyance table 14 is relatively small in comparison with the component supply table 11, and its width is smaller than the inside interval between both the leg portions of the component supply table 11 and is able to reciprocate along the guide rods 15 and 15 without coming in contact with the component supply table 11.

Further, below the conveyance table 14 is provided a threaded shaft 19 which is located in a middle position between both the guide rods 15 and 15 so as to be arranged parallel to these guide rods 15 and 15 and is fixed to support members 19a and 19a provided at both end portions of the base 22. On the lower surface side of the conveyance table 14 are provided a nut section 20 meshed with the threaded shaft 19, and a hollow motor 21 to rotationally drive this nut section 20 around the axis of the threaded shaft 19, and the hollow motor 21 is fixed to the lower surface of the conveyance table 14. The hollow motor 21 is internally mounted with the nut section 20, and the threaded shaft 19 is meshed with the nut section 20. When the nut section 20 is forwardly and reversely rotated by the hollow motor 21, the conveyance table 14 is propelled so as to be made reciprocatingly movable along the threaded shaft via the nut section 20 and the hollow motor 21 by a reaction of a propelling force exerted from the nut section 20 on the threaded shaft 19.

On the upper surface of the conveyance table 14 is provided a chuck (an example of the releasable retainer portion) 16 which is supported rotatably in the forward and reverse directions as indicated by the arrows f and b in FIG. 1 by a rotary shaft (not shown) parallel to the rails 12 and 12 and is driven by a miniature motor 18. As shown in FIG. 2, the chuck 16 is engaged with the projecting portion 13 in a state in which it pinches the projecting portion 13 in a specified rotation angle position by a recess portion 17 provided on its end surface and it does not interfere with the projecting portion 13 in another rotation angle position.

Both side surfaces which belong to the base 22 and extend in the direction in which the component supply table 11 moves are provided with a connecting member for connecting a plurality of component supply units A and B each other, so that the end surfaces of the rails 12 and 12 at the coupling are aligned with each other to allow the component supply table 11 to be reciprocally movable between the component supply units A and B. The connecting member is constructed of a positioning pin 23 which is provided on one end surface of the base 22 and is directed in a direction in which the component supply table 11 moves and a positioning hole 24 which is provided on the other end surface of the base 22 and is engaged with the above positioning pin 23, those each being provided in two places.

The component supply units A and B having the above construction are positioned by fitting the positioning pin 23 in the positioning hole 24, and the operation of the component supply table 11 when these component supply units A and B are connected together will be described below.

FIG. 2 shows the operation of the two component supply units A and B when they are connected together. The component supply table 11 of the component supply unit A pinches the projecting portion 13c of the component supply table 11 with the chuck 16 engaged with it by driving the miniature motor 18 of the component supply unit A. The component supply table 11 moves to the connected side (the left-hand side in the figure) by driving the hollow motor 21 of the conveyance table 14 of the component supply unit A and stops in a position (a state in FIG. 2) in which the projecting portion 13f located on the moving direction side (the left-hand side in FIG. 2) of the component supply table 11 can be pinched by the chuck 16 of the component supply unit B.

Then, the chuck 16 on the component supply unit A side is disengaged from the projecting portion 13c by the rotation of the miniature motor 18 of the component supply unit A, and the chuck 16 on the component supply unit B side pinches the projecting portion 13f by the rotation of the miniature motor 18 of the component supply unit B. Then, the component supply table 11 is further moved leftward by driving the hollow motor 21 of the conveyance table 14 of the component supply unit B, when the movement of the component supply table 11 between the component supply units A and B is completed. The movement toward the other side (right-hand side) can be performed similar to the aforementioned operation using the projecting portions 13c and 13r.

A component supply method for the case where three component supply units A, B and C are used so as to be connected together on the back surface of the electronic component mounting apparatus 25 as shown in FIG. 3 will be described below.

In the component supply unit A connected to the electronic component mounting apparatus 25, a center component supply table 11A is moved for positioning, and the component of the cassette 1 is supplied to the component supply position by a rotary head 26. The left and right component supply units B and C are made to serve as a standby region, and the units are replenished with components in these positions.

When supplying a component from the component supply table 11B located on the left-hand side on the component supply unit B to the rotary head 26 on the component supply unit A, firstly the center component supply table 11A on the component supply unit A is moved onto the component supply unit C on the right-hand side by the conveyance table 14 of the component supply unit A and the conveyance table 14 of the component supply unit B. Then, the component supply table 11B located on the left-hand side on the component supply unit B is moved onto the center component supply unit A by the conveyance table 14 of the component supply unit B and the conveyance table 14 of the component supply unit A.

The component supply table 11B which has moved onto the center component supply unit A moves so that its component supply cassette 1 is positioned in the component supply position by the conveyance table 14 of the component supply unit A, and the component mounted on it is supplied to the rotary head 26 in the component supply position.

When supplying a component from a component supply table 11C located on the right-hand-side on the component supply unit C to the rotary head 26 on the component supply unit A, the component supply tables 11A, 11B and 11C are moved leftward, the component supply table 11B located on the left-hand side and the center component supply table 11A are moved onto the component supply unit B located on the left-hand side, and then the component supply table 11C located on the right-hand side is moved onto the center component supply unit A.

By the above operations, components can be supplied to the rotary head 26 from the component supply tables 11A, 11B and 11C of the component supply units A, B and C which are connected together.

Figure 4:
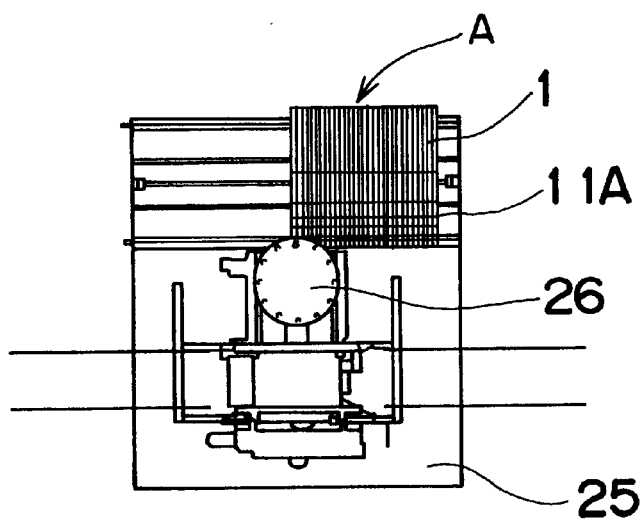
FIG. 4 is a plan view of the above component supply unit used singly in an electronic component mounting apparatus.
Figure 5:
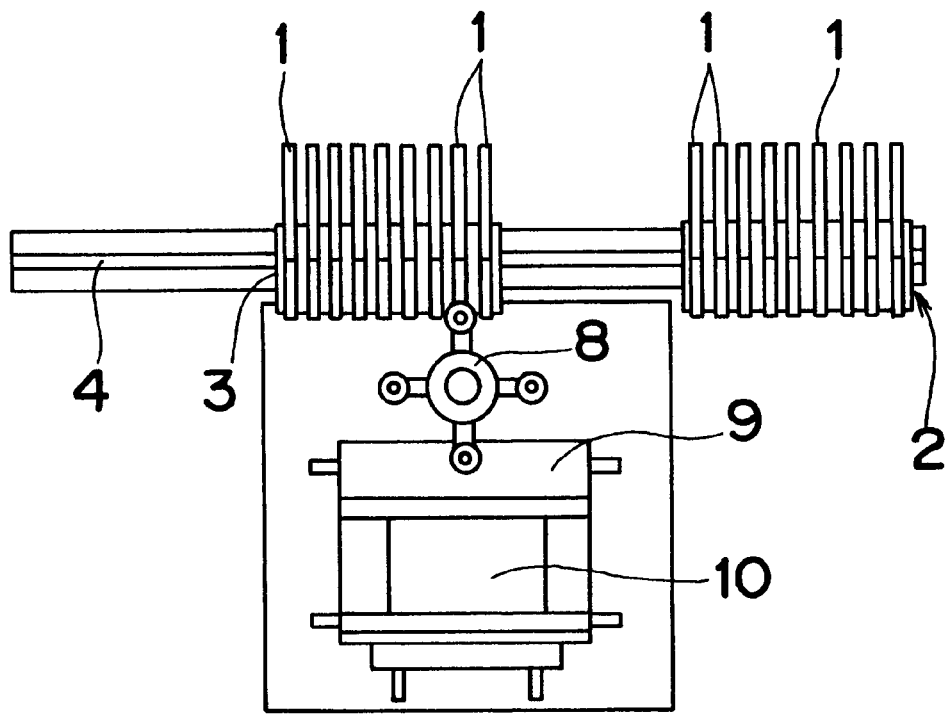
FIG. 5 is a plan view showing the overall construction of a prior art component supply apparatus.
Figure 6:
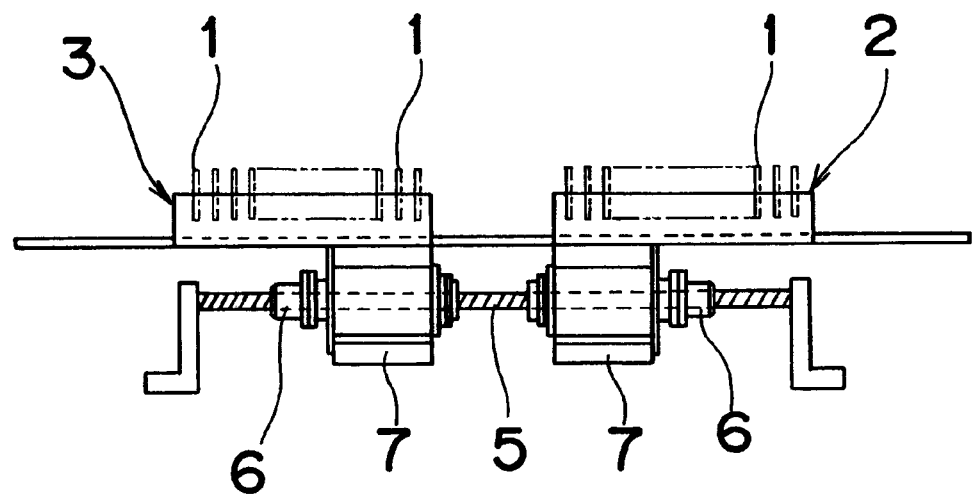
FIG. 6 is a front section view of it.

As shown in FIG. 4, the component supply unit A can be singly used.

According to the present invention, by properly combining the component supply units for a working machines such as various kinds of electronic component mounting apparatuses having variations in the number of mounted component supply cassettes, the number of necessary component supply tables and so on, a component supply apparatus appropriate for each working machine can be provided. Furthermore, the component supply units can be common, and this is advantageous in terms of production and cost.

Although one long threaded shaft has been conventionally required for the arrangement of a plurality of component supply tables, a plurality of component supply tables can be arranged by properly connecting two or not fewer than three component supply units in combination according to the aforementioned embodiment. Therefore, it is only required to provide the base of each component supply unit with a threaded shaft, so that the threaded shaft can be shortened, thereby allowing the threaded shaft to be easily processed and have a reduced rate of bending for the achievement of high positioning accuracy of each driving member.

The entire disclosure of Japanese Patent Application No. 8-126665 filed on May 22, 1996 including specification, claims, drawings, and summary are incorporated herein by reference in its entirety.

Although the present invention has been fully described in connection with the preferred embodiments thereof with reference to the accompanying drawings, a variety of modifications and corrections are apparent to those skilled in this art. It should be understood that such modifications and corrections are included within the scope of the appended claims without departing from the scope of the present invention.

We claim:

1. A component supply apparatus comprising a plurality of component supply units, the component supply units each comprising:
a component supply table mounted with a plurality of component supply cassettes having a plurality of components;
a driving member which moves in a direction in which said component supply table moves while being able to be positioned in the base; and
a coupling member which can releasably couple said component supply table with said driving member, whereby said component supply cassette of said component supply table is able to be positioned in an arbitrary position on said base by driving said driving member based on coupling between said driving member and said coupling member,
wherein the component supply table of said component supply unit can be moved and positioned in another component supply unit by its driving member by being coupled with the driving member of another component supply unit in a state in which said component supply units are connected together in a direction in which said component supply table moves.

2. A component supply apparatus as claimed in claim 1, wherein said coupling member has a plurality of engagement portions provided in positions in different directions of movement of said component supply table and a releasable retainer portion which is provided at each of said driving members and is releasably engaged with each of said engagement portions.

3. A component supply apparatus as claimed in claim 2, wherein a rail which is fixed to said base of each component supply unit and reciprocatingly movably guides and supports said component supply table is further provided, and when said component supply units are connected with each other, the rails are connected with each other so that said component supply table is moved and guided along the rails.

4. A component supply apparatus as claimed in claim 2, wherein each driving member has a threaded shaft fixed to said base in the direction in which said component supply table moves, a nut section meshed with the threaded shaft, and a hollow motor which rotationally drives the nut section around said threaded shaft to reciprocatingly move it along said threaded shaft and is able to be coupled with or decoupled from said coupling member.

5. A component supply apparatus as claimed in claim 2, further comprising:
a third component supply table mounted with a plurality of third component supply cassettes;
a third driving member which moves in a direction in which said third component supply table moves while being able to be positioned in a third base;
a third coupling member which can releasably couple said third component supply table with said third driving member; and a third component supply unit which moves said third component supply cassette of said third component supply table from said third component supply unit to said first component supply unit by driving said third driving member based on coupling between said third driving member and said third coupling member and thereafter positions it in said component supply position of said first component supply unit by said first driving member, thereby supplying a component from said third component supply cassette into said component determining position, said third driving member being able to be independently coupled with or decoupled from the first and second coupling members of said first and second component supply tables, said second component supply unit, said first component supply unit and said third component supply unit being connected together in this order in the direction in which said component supply table moves, thereby using said second and third component supply units as a standby region, whereby when replenishing said first component supply table with components by moving said first component supply table of said first component supply unit coupled with said first driving member by said first coupling member to one component supply unit side of said second and third component supply units by said first driving member and moving said unit to said one component supply unit by its driving member coupled with the driving member of said one component supply unit by said first coupling member, the component supply table of the other component supply unit is moved from the other component unit out of said second and third component supply units to said first component supply unit, thereby supplying the component of the component supply unit to said component supply position.

6. A component supply apparatus as claimed in claim 1, wherein a rail which is fixed to said base of each component supply unit and reciprocatingly movably guides and supports said component supply table is further provided, and when said component supply units are connected with each other, the rails are connected with each other so that said component supply table is moved and guided along the rails.

7. A component supply apparatus as claimed in claim 6, wherein each driving member has a threaded shaft fixed to said base in the direction in which said component supply table moves, a nut section meshed with the threaded shaft, and a hollow motor which rotationally drives the nut section around said threaded shaft to reciprocatingly move it along said threaded shaft and is able to be coupled with or decoupled from said coupling member.

8. A component supply apparatus as claimed in claim 6, further comprising:

a third component supply table mounted with a plurality of third component supply cassettes;

a third driving member which moves in a direction in which said third component supply table moves while being able to be positioned in a third base;

a third coupling member which can releasably couple said third component supply table with said third driving member; and a third component supply unit which moves said third component supply cassette of said third component supply table from said third component supply unit to said first component supply unit by driving said third driving member based on coupling between said third driving member and said third coupling member and thereafter positions it in said component supply position of said first component supply unit by said first driving member, thereby supplying a component from said third component supply cassette into said component determining position, said third driving member being able to be independently coupled with or decoupled from the first and second coupling members of said first and second component supply tables, said second component supply unit, said first component supply unit and said third component supply unit being connected together in this order in the direction in which said component supply table moves, thereby using said second and third component supply units as a standby region, whereby when replenishing said first component supply table with components by moving said first component supply table of said first component supply unit coupled with said first driving member by said first coupling member to one component supply unit side of said second and third component supply units by said driving member and moving said unit to said one component supply unit by its driving member coupled with the driving member of said one component supply unit by said first coupling member, the component supply table of the other component supply unit is moved from the other component unit out of said second and third component supply units to said first component supply unit, thereby supplying the component of the component supply unit to said component supply position.

9. A component supply apparatus as claimed in claim 1, wherein each driving member has a threaded shaft fixed to said base in the direction in which said component supply table moves, a nut section meshed with the threaded shaft, and a hollow motor which rotationally drives the nut section around said threaded shaft to reciprocatingly move it along said threaded shaft and is able to be coupled with or decoupled from said coupling member.

10. A component supply apparatus comprising first and second component supply units, said first component supply unit comprising:

a first component supply table mounted with a plurality of first component supply cassettes having a plurality of components to be supplied to a component supply position;

a first driving member which moves in a direction in which said first component supply table moves while being able to be positioned in a first base; and a first coupling member which can releasably couple said first component supply table with said first driving member, whereby said first component supply cassette of said first component supply table is positioned in said component supply position by driving said first driving member based on coupling between said first driving member and said first coupling member, thereby supplying said component from said first component supply cassette into said component determining position, said second component supply unit comprising:

a second component supply table mounted with a plurality of second component supply cassettes having a plurality of components to be supplied to said component supply position of said first component supply unit;

a second driving member which moves in a direction in which said second component supply table moves while being able to be positioned in a second base; and a second coupling member which can releasably couple said second component supply table with said second driving member, whereby said second component supply cassette of said second component supply table is moved from said second component supply unit to said first component supply unit by driving said second driving member based on coupling between said second driving member and said second coupling member and thereafter positioned in said component supply position of said first component supply unit by said first driving member, thereby supplying said component from said second component supply cassette into said component determining position, said first and second driving members being able to be independently coupled with or decoupled from said first and second component supply tables, wherein when said first and second component supply units are connected with each other in the direction in which said component supply table moves, said first component supply table enters said second component supply unit in a state in which said first component supply table of said first component supply unit is coupled with said first driving member by said first coupling member, thereafter the coupling between said first driving member of said first component supply unit and said first coupling member is released, and said first coupling member of said first component supply unit is coupled with said second driving member of said second component supply unit, thereby moving said first component supply table of said first component supply unit into said second component supply unit by said second driving member.

11. A component supply apparatus as claimed in claim 10, further comprising:

a third component supply table mounted with a plurality of third component supply cassettes;

a third driving member which moves in a direction in which said third component supply table moves while being able to be positioned in a third base;

a third coupling member which can releasably couple said third component supply table with said third driving member; and a third component supply unit which moves said third component supply cassette of said third component supply table from said third component supply unit to said first component supply unit by driving said third driving member based on coupling between said third driving member and said third coupling member and thereafter positions it in said component supply position of said first component supply unit by said first driving member, thereby supplying a component from said third component supply cassette into said component determining position, said third driving member being able to be independently coupled with or decoupled from the first and second coupling members of said first and second component supply tables, said second component supply unit, said first component supply unit and said third component supply unit being connected together in this order in the direction in which said component supply table moves, thereby using said second and third component supply units as a standby region, whereby when replenishing said first component supply table with components by moving said first component supply table of said first component supply unit coupled with said first driving member by said first coupling member to one component supply unit side of said second and third component supply units by said first driving member and moving said first component supply table of said first component supply unit to said one component supply unit by its driving member coupled with the driving member of said one component supply unit by said first coupling member, the component supply table of the other component supply unit is moved from the other component supply unit out of said second and third component supply units to said first component supply unit, thereby supplying the component of the component supply unit to said component supply position.

12. A component supply apparatus as claimed in claim 10, wherein said coupling member has a plurality of engagement portions provided in positions in different directions of movement of said component supply table and a releasable retainer portion which is provided at each of said driving members and is releasably engaged with each of said engagement portions.

13. A component supply apparatus as claimed in claim 10, wherein a rail which is fixed to said base of each component supply unit and reciprocatingly movably guides and supports said component supply table is further provided, and when said component supply units are connected with each other, the rails are connected with each other so that said component supply table is moved and guided along the rails.

14. A component supply apparatus as claimed in claim 10, wherein each driving member has a threaded shaft fixed to said base in the direction in which said component supply table moves, a nut section meshed with the threaded shaft, and a hollow motor which rotationally drives the nut section around said threaded shaft to reciprocatingly move it along said threaded shaft and is able to be coupled with or decoupled from said coupling member.

* * * * *